(12) United States Patent
Hashimoto (10) Patent No.: US 7,576,555 B2
(45) Date of Patent: Aug. 18, 2009

(54) CURRENT MEASURING APPARATUS, TEST APPARATUS, CURRENT MEASURING METHOD AND TEST METHOD

(75) Inventor: Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/755,746

(22) Filed: Jul. 30, 2008

(65) Prior Publication Data

US 2009/0021239 A1    Jan. 22, 2009

Related U.S. Application Data (63) Continuation of application No. PCT/JP2006/303198, filed on Feb. 22, 2006.

(30) Foreign Application Priority Data

Feb. 25, 2005   (JP) .............................. 2005-050071

(51) Int. Cl.
    *G01R 31/26*    (2006.01)
(52) U.S. Cl. ...................................... 324/765
(58) Field of Classification Search ............... 324/111, 324/158.1, 522, 763–765, 713; 327/63, 82; 340/644
See application file for complete search history.

(56) References Cited

U.S. PATENT DOCUMENTS 7,446,549 B2 * 11/2008 Tomita et al. ............... 324/763

7,482,829 B2 * 1/2009 Hirata et al. ................ 324/765

FOREIGN PATENT DOCUMENTS

| JP | 07-248358 | 9/1995 |
|----|-----------|--------|
| JP | 10-246759 | 9/1998 |
| JP | 2001-041997 | 2/2001 |
| JP | 2004-347421 | 12/2004 |

* cited by examiner

*Primary Examiner*—Ha Tran T Nguyen
*Assistant Examiner*—Trung Q Nguyen
(74) *Attorney, Agent, or Firm*—Jianq Chyun IP Office (57) ABSTRACT

There is provided a current measuring apparatus that measures an electric current received by an electronic device from an input terminal, The current measuring apparatus includes a first voltage accumulator that accumulates a reference supply voltage that acts as a reference for a voltage being supplied to the electronic device during measuring electric currents, a first switch that connects a power supply to the first voltage accumulator to accumulate the reference supply voltage before measuring electric currents and disconnects the power supply from the first voltage accumulator during measuring electric currents, a current supplying section that supplies an electric current based on the reference supply voltage accumulated in the first voltage accumulator and a terminal voltage of the input terminal to the electronic device during measuring electric currents, and a first current measuring section that measures the supply current supplied to the electronic device.

17 Claims, 7 Drawing Sheets

CURRENT MEASURING APPARATUS, TEST APPARATUS, CURRENT MEASURING METHOD AND TEST METHOD

CROSS REFERENCE TO RELATED APPLICATION

This is a continuation application of PCT/JP2006/303198 filed on Feb. 22, 2006 which claims priority from a Japanese Patent Application NO. 2005-050071 filed on Feb. 25, 2005, the contents of which are incorporated herein by reference.

BACKGROUND

1. Technical Field

The present invention relates to a current measuring apparatus, a test apparatus, a current measuring method, and a test method. More particularly, the present invention relates to a current measuring apparatus that measures electric currents received by an electronic device, a test apparatus, a current measuring method, and a test method.

2. Related Art

Conventionally, as an example of a current measuring apparatus that measures electric currents received by an electronic device, an apparatus, which includes a large current measuring power supply circuit mainly used for measuring electric currents that the electronic device consumes during an operation and a small current measuring power supply circuit mainly used for measuring leakage currents during quiescence of the electronic device, has been disclosed as disclosed, for example, in Japanese Patent Application Publication No. 2001-41997 and Japanese Patent Application Publication No. 2004-347421.

As a device manufacturing process has been miniaturized recently, a high-density and high-speed electronic device has been manufactured. In this way, since more lots of elements are switched at higher speeds, a CMOS circuit particularly consumes large currents during an operation of the electronic device. Therefore, the capacity of a smoothing capacitor for stabilizing a power supply, which is provided between a terminal of an electronic device under test and a ground in Patent Documents 1 and 2 should be larger than ever before. Moreover, the number of gates mounted on the electronic device has been increased along with highly densifying the electronic device, so that leakage currents tend to increase even if the electronic device is in a stationary state.

On the other hand, as the device manufacturing process is miniaturized, widths of a gate and an insulated portion of wiring become narrower. For this reason, leakage currents caused by bad insulation becomes more minute, and thus a detection of the bad insulation becomes more difficult.

On the contrary, according to a quiescent current measuring power supply circuit in Patent Document 1, when a large noise occurs in a voltage source for a reference voltage, electric currents to be supplied to the electronic device are largely fluctuated and thus a measurement of a minute leakage current becomes difficult. Moreover, when the capacity of the smoothing capacitor is increased, electric currents to be supplied by a power supply circuit become large in accordance with a difference between an output voltage and a reference voltage. However, when the electric currents supplied by the power supply circuit become large in accordance with the difference between the output voltage and the reference voltage, large noise currents are supplied and measured in accordance with a noise voltage of the output voltage.

SUMMARY

Therefore, it is an object of the present invention to provide a current measuring apparatus, a test apparatus, a current measuring method, and a test method that can solve the foregoing problems. The above and other objects can be achieved by combinations described in the independent claims. The dependent claims define further advantageous and exemplary combinations of the present invention.

According to the first aspect of the present invention, there is provided a current measuring apparatus that measures an electric current received by an electronic device from an input terminal. The current measuring apparatus includes: a first voltage accumulator that accumulates a reference supply voltage that acts as a reference for a voltage being supplied to the electronic device during measuring electric currents; a first switch that connects a power supply to the first voltage accumulator to accumulate the reference supply voltage before measuring electric currents and disconnects the power supply from the first voltage accumulator during measuring electric currents; a current supplying section that supplies an electric current based on the reference supply voltage accumulated in the first voltage accumulator and a terminal voltage of the input terminal to the electronic device during measuring electric currents; and a first current measuring section that measures the supply current supplied to the electronic device.

The current supplying section may include: a first difference amplifier that amplifies a difference obtained by subtracting the terminal voltage from the reference supply voltage, adds the amplified voltage to the reference supply voltage, and outputs the added voltage; and a resistor that is connected between an output of the first difference amplifier and the input terminal and supplies the supply current according to a difference between the output voltage output from the first difference amplifier and the terminal voltage to the input terminal.

The first current measuring section may include: a difference operator that outputs a difference voltage obtained by subtracting the terminal voltage of the input terminal side in the resistor from the output voltage of the first difference amplifier side in the resistor; and a measuring section that measures the supply current based on the difference voltage.

The first current measuring section may further include: a voltage source that outputs a preset reference voltage for measurement; and a second difference amplifier that outputs a difference amplification voltage obtained by amplifying a difference between the difference voltage and the reference voltage for measurement, and the measuring section may measure the supply current based on the difference amplification voltage.

The first current measuring section may further include a low-pass filter that is connected between the voltage source and the second difference amplifier.

The current measuring apparatus may further include a correction section that corrects the reference supply voltage by adding a correction voltage according to the difference voltage to the reference supply voltage, and the current supplying section may supply an electric current based on the reference supply voltage corrected by the correction section and the terminal voltage to the electronic device during measuring electric currents.

The correction section may include: an adder that adds the correction voltage according to the difference voltage to the reference supply voltage; and a second voltage accumulator that accumulates an output voltage of the adder and supplies the accumulated voltage to the first difference amplifier.

The correction section may further include a second switch that is provided between an output of the adder and the second voltage accumulator, connects the second voltage accumulator to the output of the adder to accumulate the output voltage of the adder for a predetermined period from starting a current measurement, and disconnects the second voltage accumulator from the output of the adder after the predetermined period elapses.

The current measuring apparatus may further include a power supply that supplies the reference supply voltage to the first voltage accumulator and the input terminal before measuring electric currents; a third switch that disconnects the power supply from the first voltage accumulator and the input terminal during measuring electric currents; and a voltage adjusting section that adds a predetermined offset voltage to the reference supply voltage accumulated in the first voltage accumulator and supplies the added voltage to the current supplying section during measuring electric currents, in order to increase the terminal voltage during measuring electric currents in comparison with the terminal voltage before measuring electric currents.

The third switch may: be provided between a contact point of a wire between the power supply and the input terminal and a wire between an end of the first switch that is not connected to the first voltage accumulator and the power supply and an output terminal of the power supply; and serially have a first transistor that blocks electric currents flowing from the output terminal side of the power supply to the contact point side and a second transistor that blocks electric currents from the contact point side to the output terminal side of the power supply between the output terminal of the power supply and the contact point when the third switch is turned off.

The current measuring apparatus may further include: a fourth switch that is provided between a terminal of the input terminal side of the third switch and the first difference amplifier; a fifth switch that is provided between an end of the input terminal side of the resistor and the input terminal; a second current measuring section that measures an electric current being supplied to the input terminal by the power supply; and a test control section that controls an operating current test for measuring operating currents received by the electronic device during an operation and a quiescent current test for measuring quiescent currents received by the electronic device during quiescence, and the test control section may cause: the third switch to be turned on, the fourth and fifth switches to be turned off, and the second current measuring section to measure the electric current being supplied to the input terminal by the power supply as the operating currents in the operating current test; and the third switch to be turned off, the fourth and fifth switches to be turned on, and the first current measuring section to measure the electric current supplied to the electronic device based on the reference supply voltage accumulated in the first voltage accumulator and the terminal voltage as the quiescent currents in the quiescent current test.

The current measuring apparatus may further include a measurement invalidity detecting section that detects that this current measurement is invalid when the supply current measured by the first current measuring section becomes larger than a preset threshold current value during measuring electric currents.

The current measuring apparatus may further include: a power supply that supplies the reference supply voltage to the first voltage accumulator and the input terminal before measuring electric currents; and a third switch that disconnects the power supply from the first voltage accumulator and the input terminal during measuring electric currents, and the measurement invalidity detecting section may turn on the third switch to cause the third switch to supply electric currents from the power supply to the electronic device when it is detected that the current measurement is invalid.

The first voltage accumulator and the second voltage accumulator may be capacitors.

According to the second aspect of the present invention, there is provided a test apparatus that tests an electronic device. The test apparatus includes: a first voltage accumulator that accumulates a reference supply voltage that acts as a reference for a voltage being supplied to the electronic device during measuring electric currents: a first switch that connects a power supply to the first voltage accumulator to accumulate the reference supply voltage before measuring electric currents and disconnects the power supply from the first voltage accumulator during measuring electric currents; a current supplying section that supplies an electric current based on the reference supply voltage accumulated in the first voltage accumulator and a terminal voltage of an input terminal of the electronic device to the electronic device during measuring electric currents; and a first current measuring section that measures a supply current supplied to the electronic device.

According to the third aspect of the present invention, there is provided a current measuring method for measuring an electric current received by an electronic device from an input terminal. The current measuring apparatus includes: accumulating a reference supply voltage that acts as a reference for a voltage being supplied to the electronic device in a first voltage accumulator during measuring electric currents; connecting a power supply to the first voltage accumulator to accumulate the reference supply voltage before measuring electric currents and controlling a first switch so as to disconnect the power supply from the first voltage accumulator during measuring electric currents; supplying an electric current based on the reference supply voltage accumulated in the first voltage accumulator and a terminal voltage of the input terminal to the electronic device during measuring electric currents; and measuring the supply current supplied to the electronic device.

According to the fourth aspect of the present invention, there is provided a test method for testing an electronic device. The test method includes: accumulating a reference supply voltage that acts as a reference for a voltage being supplied to the electronic device in a first voltage accumulator during measuring electric currents; connecting a power supply to the first voltage accumulator to accumulate the reference supply voltage before measuring electric currents and controlling a first switch so as to disconnect the power supply from the first voltage accumulator during measuring electric currents; supplying an electric current based on the reference supply voltage accumulated in the first voltage accumulator and a terminal voltage of an input terminal of the electronic device to the electronic device during measuring electric currents; and measuring the supply current supplied to the electronic device.

The summary of the invention does not necessarily describe all necessary features of the present invention. The present invention may also be a sub-combination of the features described above.

DESCRIPTION OF EXEMPLARY EMBODIMENTS

The invention will now be described based on the preferred embodiments, which do not intend to limit the scope of the present invention, but exemplify the invention. All of the features and the combinations thereof described in the embodiment are not necessarily essential to the invention.

Figure 1:
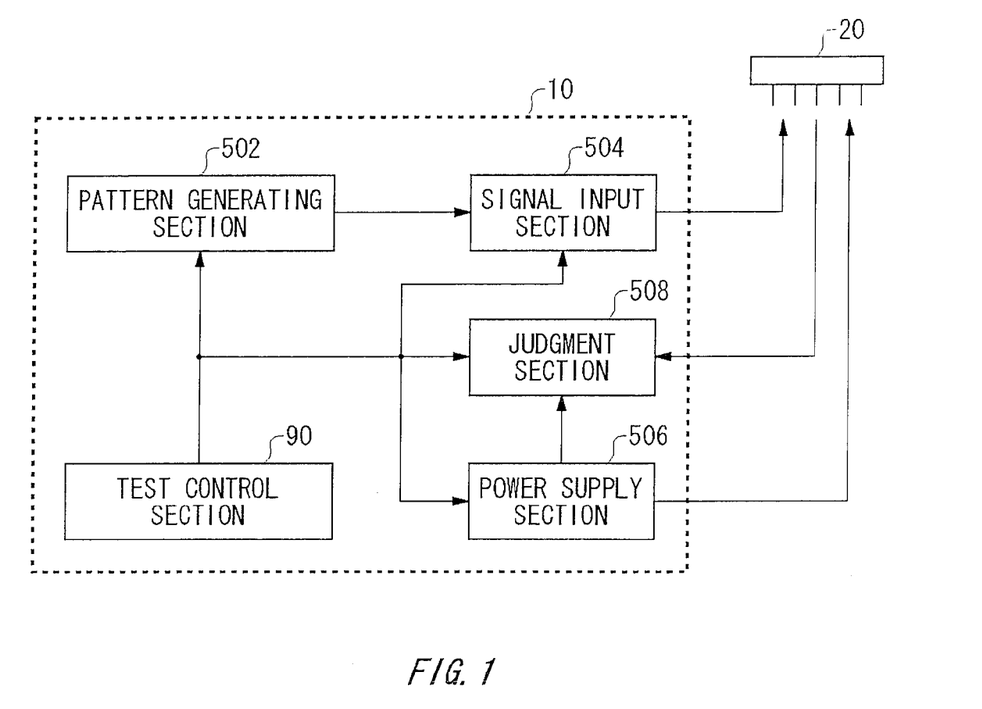
FIG. 1 is a view showing a configuration of a current measuring apparatus 10 according to an embodiment of the present invention.

FIG. 1 is a view showing a configuration of a current measuring apparatus 10 according to the present embodiment along with an electronic device 20. The current measuring apparatus 10 measures electric currents acquired by the electronic device 20, which is a device under test (DUT) such as an LSI, from an input terminal such as a power supply terminal. The current measuring apparatus 10 is, e.g., a test apparatus that tests the electronic device 20, and performs an operating current test for measuring electric currents consumed by the electronic device 20 during its operation and a quiescent current test for measuring leakage currents in a stationary state. The current measuring apparatus 10 according to the present embodiment can reduce noises of currents supplied to the electronic device 20 during the quiescent current test and measure the leakage currents with higher precision.

The current measuring apparatus 10 includes a test control section 90, a power supply section 506, a pattern generating section 502, a signal input section 504, and a judgment section 508. The test control section 90 controls the power supply section 506, the pattern generating section 502, the signal input section 504, and the judgment section 508. The power supply section 506 is a power supply apparatus that supplies power supply currents to the electronic device 20. The power supply section 506 measures the sizes of power supply currents supplied to the electronic device 20 during an operating current test and a quiescent current test for the electronic device 20, and informs the judgment section 508 of the measured results. The pattern generating section 502 executes a sequence of a test program based on instructions of the test control section 90, and generates test patterns to be supplied to the electronic device 20.

The signal input section 504 receives and shapes the test patterns to generate test signals to be supplied to the electronic device 20. In other words, for example, the signal input section 504 generates a designated signal waveform at a timing specified by the test pattern. Then, the signal input section 504 supplies the test signals to the electronic device 20. The judgment section 508 judges a quality of the electronic device 20 based on signals output from the electronic device 20 in accordance with the test signals. Moreover, the judgment section 508 judges a quality of the electronic device 20 based on the sizes of the power supply currents supplied to the electronic device 20. As described above, the current measuring apparatus 10 may function as a current measuring apparatus according to the present invention.

Figure 2:
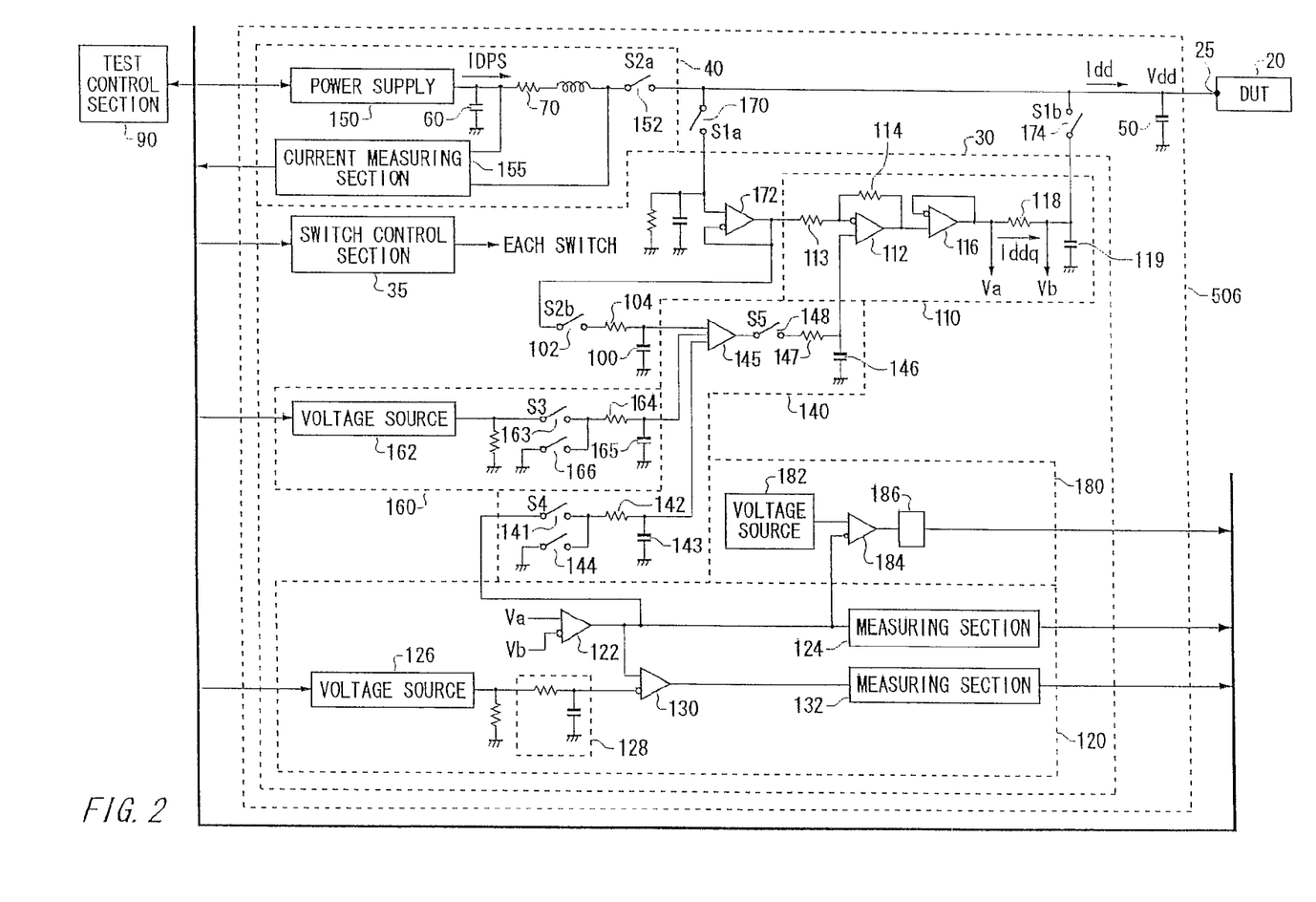
FIG. 2 is a view showing a configuration of a power supply section 506 according to an embodiment of the present invention.

FIG. 2 is a view showing a configuration of the power supply section 506 according to the present embodiment along with the electronic device 20 and the test control section 90. The power supply section 506 includes a current measuring section 30, a current measuring section 40, and a capacitor 50. The current measuring section 30 is mainly used for a quiescent current test for the electronic device 20. The current measuring section 30 supplies smaller electric currents than those of the current measuring section 40 to the electronic device 20, and measures the size of the supplied supply currents in order to measure electric currents received by the electronic device 20. The current measuring section 40 is mainly used for an operating current test for the electronic device 20. During a functional test for the electronic device 20, the current measuring section 40 supplies larger electric currents than those of the current measuring section 30 to the electronic device 20, and measures the size of the supplied electric currents in order to measure electric currents received by the electronic device 20. When electric currents consumed by the electronic device 20 are temporarily increased, the capacitor 50 is a smoothing capacitor for preventing a fluctuation of a terminal voltage of an input terminal 25 due to a delay until the amounts of electric currents supplied by the current measuring section 30 and the current measuring section 40 are increased.

The current measuring section 30 is an example of a current measuring apparatus according to the present invention, and supplies electric currents to the electronic device 20 and measures the electric currents received from the input terminal of the electronic device 20. In place of generating a voltage acting as a reference of the terminal voltage of the input terminal 25 by a power supply or the like, the current measuring section 30 according to the present embodiment controls the terminal voltage of the electronic device 20 using a voltage accumulated in a capacitor 100 as a reference. Therefore, the current measuring section 30 can supply stabilized electric currents with low noise currents to the electronic device 20.

The current measuring section 30 has a switch control section 35, a voltage follower 172, the capacitor 100, a switch 102, a resistor 104, a current supplying section 110, a current measuring section 120, a correction section 140, a voltage adjusting section 160, a measurement invalidity detecting section 180, a switch 170, and a switch 174. The switch control section 35 controls on or off of each switch (102, 141, 144, 148, 163, 166, 170, 174, etc.) within the current measuring section 30. Moreover, the switch control section 35 according to the present embodiment further controls on or off of a switch 152 within the current measuring section 40.

A positive input of the voltage follower 172 is connected to the input terminal 25 via the switch 170 and its negative input is connected to an output of the voltage follower 172. The voltage follower 172 changes an output voltage in accordance with an input voltage and the output voltage to output the output voltage obtained by stabilizing the input voltage. The output port of the voltage follower 172 is connected to the switch 102 and a resistor 113 within the current supplying section 110.

The capacitor 100 accumulates a reference supply voltage that becomes a reference for the voltage to be supplied to the electronic device 20 during measuring electric currents. The capacitor 100 is connected between an input of the reference supply voltage to the correction section 140 and a ground. The switch 102 is connected between an end of a reference supply voltage output side of the capacitor 100 and a power supply 150. The switch 102 is turned on by the switch control section 35 before the current measuring section 30 measures electric currents and connects the power supply 150 within the current measuring section 40 to the capacitor 100, in order to accumulate the reference supply voltage. Moreover, the switch 102 is turned off by the switch control section 35 while the current measuring section 30 measures electric currents, in order to disconnect the power supply 150 from the capacitor 100. According to this, the capacitor 100 can input the voltage accumulated during measuring electric currents into the correction section 140 without discharging most of the voltage. The resistor 104 is connected between an end of the capacitor 100 side of the switch 102 and the end of the reference supply voltage output side of the capacitor 100.

The current supplying section 110 inputs the reference supply voltage of the capacitor 100 via the correction section 140 during measuring electric currents by the current measuring section 30 and inputs a terminal voltage of the input terminal 25 via the switch 170 and the voltage follower 172. Then, the current supplying section 110 supplies an electric current based on the reference supply voltage accumulated in the capacitor 100 and the terminal voltage of the input terminal 25 to the electronic device 20 during measuring electric currents by the current measuring section 30.

The current supplying section 110 includes a difference amplifier 112, a resistor 113, a resistor 114, a voltage follower 116, a resistor 118, and a capacitor 119. The difference amplifier 112 is an example of a first difference amplifier according to the present invention, and amplifies a difference obtained by subtracting the terminal voltage from the reference supply voltage input via the correction section 140 and outputs a voltage obtained by adding the amplified difference to the reference supply voltage. More specifically, when the terminal voltage is lower than the reference supply voltage, the difference amplifier 112 outputs a voltage obtained by adding a positive voltage, which is obtained by amplifying the difference obtained by subtracting the terminal voltage from the reference supply voltage, to the reference supply voltage. Moreover, When the terminal voltage is higher than the reference supply voltage, the difference amplifier 112 outputs a voltage obtained by adding a negative voltage, which is obtained by amplifying the difference obtained by subtracting the terminal voltage from the reference supply voltage, to the reference supply voltage. The resistor 113 and the resistor 114 determine an amplification factor of the difference amplifier 112. More specifically, when a resistance value of the resistor 113 is Ri and a resistance value of the resistor 114 is Rf, an amplification factor G becomes Rf/Ri. In addition, it is desirable that this amplification factor is not less than one in order to reduce a degradation amount of the terminal voltage of the input terminal 25.

The voltage follower 116 is a difference operator, and of which a positive input is connected to an output of the difference amplifier 112 and a negative input is connected to an output of the voltage follower 116. The voltage follower 116 changes an output voltage in accordance with an input voltage and an output voltage to output the output voltage obtained by stabilizing the input voltage. The resistor 118 is connected between the output of the difference amplifier 112 and the input terminal 25, and supplies a supply current according to a difference between the output voltage from the difference amplifier 112 and the terminal voltage of the input terminal 25 to the input terminal 25. The capacitor 119 is connected between an end of the resistor 118 at the input terminal 25 side and a ground, and stabilizes electric currents being supplied to the input terminal 25 via the resistor 118.

The current measuring section 120 is an example of a first current measuring section according to the present invention, and measures a supply current supplied to the electronic device 20 by the current supplying section 110. The current measuring section 120 includes a difference operator 122, a measuring section 124, a voltage source 126, a low-pass filter 128, a difference amplifier 130, and a measuring section 132. The difference operator 122 is connected between the voltage follower 116 and the input terminal 25, and outputs a difference voltage obtained by subtracting a terminal voltage of the resistor 118 at the input terminal 25 side from an output voltage of the resistor 118 at the difference amplifier 112 side. The measuring section 124 measures the supply current based on the difference voltage. More specifically, when a resistance value of the resistor 118 is Rn and the difference voltage is Vim, the measuring section 124 measures the difference voltage Vim by means of an analog-to-digital converter or the like and computes a supply current Iddq (=Vim/Rm) by dividing the difference voltage Vim by the resistance value kin.

The voltage source 126, the difference amplifier 130, the measuring section 132, and the low-pass filter 128 are provided in order to measure the supply current Iddq to the electronic device 20 with higher accuracy than the measurement by the measuring section 124. The voltage source 126 includes, e.g., a DA converter that converts a digital voltage set value set by the test control section 90 into an analog voltage, and outputs a reference voltage for measurement preset by the test control section 90. The difference amplifier 130 outputs a difference amplification voltage obtained by amplifying a difference between a difference voltage output from the difference operator 122 and a reference voltage for measurement output from the voltage source 126. The measuring section 132 measures the supply current based on the difference amplification voltage output from the difference amplifier 130. The low-pass filter 128 is connected between the voltage source 126 and the difference amplifier 130, and stabilizes the reference voltage for measurement output from the voltage source 126.

For example, when the measuring section 124 measures the supply current Iddq per µA in the case that a theoretical value of the electric current Iddq received by the electronic device 20 is 20 mA in the stationary state, it is necessary that the measuring section 124 should measure the voltage of the difference operator 122 as a digital value not less than 15 bits. The reason is that 20 mA/1 µA=20,000 and $2^{14}<20,000<2^{15}$.

Therefore, when measuring a supply current with high accuracy, the current measuring apparatus 10 makes the voltage source 126 previously output a reference voltage Vref for measurement. The current measuring apparatus 10 sets a voltage substantially equal to the voltage output from the difference operator 122 in the voltage source 126 in correspondence with the electric current Iddq that is slightly smaller than the theoretical value, so that a Vref becomes smaller than the voltage output from the difference operator 122.

The difference amplifier 130 outputs a voltage obtained by amplifying by N times a difference voltage Vim2 (=Vim1−Vref) between an output voltage Vim1 of the difference operator 122 and the reference voltage Vref for measurement. The measuring section 132 can measure the voltage output from the difference amplifier 130, in order to precisely measure the supply current Iddq by means of an analog-to-digital converter having small bits in comparison with the case that the output voltage of the difference operator 122 is directly measured.

For example, when a theoretical value of the electric current Iddq received by the electronic device 20 is 20 mA in the stationary state and a discrepancy between the theoretical value and an actual current value is ±1 mA, if Vref=19 mA, the difference amplifier 130 outputs a difference amplification voltage corresponding to a current difference $\Delta$Iddq=0 to 2 mA. Therefore, when the supply current Iddq is measured per $\mu$A by means of the measuring section 132, it is preferable that the measuring section 132 measures the voltage of the difference amplifier 130 as a digital value of 11 bits. The reason is that 2 mA/1 $\mu$A=2,000 and $2^{10}$<2,000<$2^{11}$.

Moreover, when a supply current difference $\Delta$Iddq by each electronic device 20 is 10% of the theoretical value of the supply current Iddq, it is preferable that the voltage source 126 can output the reference voltage Vref for measurement with voltage-unit resolution power corresponding to 10% of the supply current Iddq. Then, it is preferable that a value obtained by multiplying measurement resolution power of the measuring section 132 by setting resolution power of the voltage source 126 becomes equal to or more than a value obtained by dividing the supply current Iddq by a measurement unit (for example, 1 $\mu$A).

Moreover, when a plurality of points are measured in the electronic device 20 to obtain supply current differences $\Delta$Iddq, since an error of the reference voltage Vref for measurement by the voltage source 126 is offset, the precise supply current differences $\Delta$Iddq can be obtained.

Then, since the reference voltage Vref for measurement output from the voltage source 126 is not changed during the measurement period, an accurate current value can be obtained during a shorter measurement period by providing the low-pass filter 128 between the voltage source 126 and the difference amplifier 130, in comparison with providing a low-pass filter between the difference amplifier 130 and the measuring section 132 to reduce noises.

The correction section 140 adds a correction voltage according to the difference voltage output from the difference operator 122 to the reference supply voltage of the capacitor 100, in order to correct the reference supply voltage. According to this, when the electric current Iddq received by the electronic device 20 depends on the terminal voltage Vdd of the electronic device 20, the more accurate current Iddq can be measured by correcting the terminal voltage of the electronic device 20. In the present embodiment, an operation mode of the current measuring apparatus 10 that corrects the reference supply voltage in accordance with the difference voltage is shown as a voltage correction mode. Moreover, the correction section 140 adjusts the reference supply voltage to be supplied to the difference amplifier 112 within the current supplying section 110 in accordance with a voltage output from the voltage adjusting section 160.

The correction section 140 includes a switch 141, a resistor 142, a capacitor 143, a switch 144, an adder 145, a capacitor 146, a resistor 147, and a switch 148. The switch 141 is connected between an output of the difference operator 122 and an input of the adder 145. When the correction in which the correction voltage based on the difference voltage is added to the reference supply voltage is performed during measuring electric currents, the switch 141 is turned on by the switch control section 35 and supplies the difference voltage of the difference operator 122 to the adder 145. On the other hand, when this correction is not performed, the switch 141 is turned off by the switch control section 35 during measuring electric currents. The resistor 142 is connected between the switch 141 and the adder 145.

The capacitor 143 is connected between the input of the adder 145 and a ground. Similarly to the capacitor 100, the capacitor 143 stabilizes the difference voltage of the difference operator 122 and supplies the stabilized voltage to the adder 145. More specifically, when the above-mentioned correction is performed, the switch control section 35 turns on the switch 141, turns off the switch 144, and causes the capacitor 143 to accumulate the difference voltage of the difference operator 122 during the quiescent current test. Then, before the current measuring section 120 measures the electric currents supplied to the electronic device 20, the switch control section 35 turns off the switch 141. According to this, the capacitor 100 can supply the accumulated difference voltage to the adder 145.

The switch 144 is connected between the end of the adder 145 side of the switch 141 and a ground. When the above-mentioned correction is performed, the resistor 142 is turned off by the switch control section 35. On the other hand, when this correction is not performed, the resistor 142 is turned on by the switch control section 35 and makes the input into the adder 145 as 0V, in order not to correct the reference supply voltage.

When the above-mentioned correction is performed, the adder 145 amplifies the difference voltage output from the difference operator 122 and accumulated in the capacitor 143 at a predetermined amplification factor, adds the amplified voltage to the reference supply voltage, and supplies the added voltage to the difference amplifier 112 as a corrected reference supply voltage. According to this, the current supplying section 110 can supply the electric currents based on the reference supply voltage corrected by the correction section 140 and the terminal voltage of the input terminal 25 to the electronic device 20 during measuring electric currents. Moreover, the adder 145 further adds a voltage output from the voltage adjusting section 160 to the reference supply voltage in order to adjust the reference supply voltage.

The capacitor 146 is connected between a wire between the adder 145 and the difference amplifier 112 and a ground, and accumulates therein the voltage output from the adder 145 to supply the accumulated voltage to the difference amplifier 112 during measuring electric currents. The switch 148 is provided between the output of the adder 145 on the wire between the adder 145 and the difference amplifier 112 and the capacitor 146. The switch 148 is controlled by the switch control section 35, and connects the capacitor 146 to the output of the adder 145 in order to cause the capacitor 146 to accumulate the voltage output from the adder 145 for a predetermined period from starting the current measurement to test quiescent currents. Then, after this predetermined period elapses, the switch 148 disconnects the connection between the output of the adder 145 and the capacitor 146 and causes the capacitor 146 to supply the accumulated voltage therein to the difference amplifier 112. The resistor 147 is connected between the switch 148 and the capacitor 146.

In addition, the current measuring apparatus 10 that does not perform the above-mentioned correction or the like may have a configuration without the correction section 140, and thus the capacitor 100 may be directly connected to the difference amplifier 112.

The voltage adjusting section 160 is connected to the input of the adder 145. Then, the voltage adjusting section 160 adds an offset voltage preset by the test control section 90 to the reference supply voltage accumulated in the capacitor 100 during measuring electric currents, and supplies the added voltage to the current supplying section 110 via the correction section 140. The voltage adjusting section 160 according to the present embodiment adjusts the offset voltage to 0V before the current measurement and adjusts the offset voltage to a positive value during the current measurement, in order to make higher terminal voltage during measuring electric currents than the terminal voltage before the current measurement. According to this, the voltage adjusting section 160 can compare the terminal voltage during a logically set period (a setup period) within the electronic device 20 before the test for quiescent currents with the terminal voltage during the test for quiescent currents and take a lower value, and thus the voltage adjusting section 160 can prevent the measurement of high leak currents due to a heat emission of the electronic device 20 for the setup period. In the present embodiment, the operation mode of the current measuring apparatus 10 in which the terminal voltage during the current measurement is higher than the terminal voltage before the current measurement is referred to as a voltage-variable mode.

The voltage adjusting section 160 includes a voltage source 162, a switch 163, a resistor 164, a capacitor 165, and a switch 166. The voltage source 162 is, for example, a DA converter, and outputs an offset voltage according to the setting by the test control section 90. The switch 163 is provided on a wire between the voltage source 162 and the adder 145, and is controlled by the switch control section 35. The voltage source 162 is provided between a wire between the switch 1663 and the adder 145 and a ground, and is controlled by the switch control section 35.

The capacitor 165 is connected between the wire between the switch 163 and the adder 145 and a ground, and accumulates an offset voltage while the switch 163 is in the ON state and continuously supplies the offset voltage to the adder 145 even when the switch 163 is in the OFF state. The resistor 164 is provided between the switch 163 on the wire between the switch 163 and the adder 145 and the capacitor 165.

The voltage adjusting section 160 described above makes the switch 163 to be turned off and the switch 166 to be turned on before the quiescent current test. According to this, the voltage of 0V is supplied to the adder 145. According to this, before the quiescent current test, the adder 145 can output the reference supply voltage to the current supplying section 110 without adding the offset voltage to the reference supply voltage. On the other hand, during the quiescent current test, the switch 1663 is turned on and the switch 166 is turned off. According to this, the adder 145 adds the offset voltage to the reference supply voltage and outputs the added voltage to the current supplying section 110. Moreover, after the elapse of the predetermined period from starting the quiescent current test, the switch 163 may be turned off. According to this, the capacitor 165 can stabilize the accumulated offset voltage and supply the stabilized voltage to the adder 145.

The measurement invalidity detecting section 180 inputs the difference voltage output from the difference operator 122, and detects that this current measurement is invalid when the supply current measured by the current measuring section 120 becomes larger than a preset threshold current during measuring electric currents. The measurement invalidity detecting section 180 includes a voltage source 182, a difference operator 184, and an invalidity recording section 186. The voltage source 182 outputs a voltage corresponding to this threshold current. The difference operator 184 subtracts the difference voltage output from the difference operator 122 in accordance with the supply current from the voltage of the voltage source 182. When the output voltage of the difference operator 184 becomes a negative value during measuring electric currents, the invalidity recording section 186 records that this current measurement is invalid and informs the test control section 90 of the invalidity.

The switch 170 is provided between a wire between the switch 152 within the current measuring section 40 and the input terminal 25 and the difference amplifier 112. More specifically, the switch 170 is provided between a terminal of the input terminal 25 side of the switch 152 within the current measuring section 40 and the voltage follower 172 provided between the switch 170 and the difference amplifier 112. The switch 174 is provided between an end of the input terminal 25 side of the resistor 118 and the input terminal 25.

The current measuring section 40 has a power supply 150, the switch 152, a capacitor 60, a resistor 70, and a current measuring section 155. The power supply 150 supplies electric currents to the electronic device 20 during the operating current test. Moreover, before measuring the electric currents in the quiescent current test, the power supply 150 supplies the reference supply voltage to the capacitor 100 and the input terminal 25. The switch 152 disconnects the power supply 150 from the capacitor 100 and the input terminal 25 during the quiescent current measurement. The capacitor 60 is connected between a wire between the power supply 150 and the switch 152 and a ground. When the electric current Idd is largely varied by an operation of the electronic device 20, the capacitor 60 prevents the terminal voltage of the input terminal 25 from decreasing. The resistor 70 is provided on a wire between the capacitor 60 and the switch 152. While the switch 152 is being turned on, the resistor 70 flows the electric currents according to a difference between the output voltage of the power supply 150 and the terminal voltage of the input terminal 25 into the electronic device 20.

The current measuring section 155 is an example of a second current measuring section according to the present invention, and inputs the voltages of both ends of the resistor 70 and measures electric currents being supplied to the input terminal 25 from the power supply 150. In other words, for example, similarly to the current measuring section 120 that measures electric currents based on the voltages of both ends of the resistor 118, the current measuring section 155 measures the electric currents supplied to the electronic device 20 during the operating current test for the electronic device 20 based on a potential difference between both ends of the resistor 70.

In the current measuring apparatus 10 described above, the test control section 90 controls the operating current test and the quiescent current test for the electronic device 20 as follows. In the operating current test for measuring operating currents received by the electronic device 20 during an operation, the test control section 90 controls the switch control section 35 in order to turn on the switch 152 and turn off the switch 170 and the switch 174, and then the test control section 90 causes the current measuring section 155 to measure the electric currents being supplied to the input terminal 25 from the power supply 150 as operating currents.

On the other hand, in the quiescent current test for measuring quiescent currents received by the electronic device 20 during quiescence, the test control section 90 controls the switch control section 35 during the setup period for the quiescent current test in order to turn on the switch 152, the switch 170, the switch 174, the switch 102, and the switch 148, and then the test control section 90 causes the capacitor 100 and the capacitor 146 to accumulate the reference supply voltage supplied from the power supply 150 and supply the reference supply voltage to the electronic device 20. Then, when the current measurement is begun, the test control section 90 controls the switch control section 35 to turn off the switch 152, turn on the switch 170 and the switch 174, and turn off the switch 102, and then the test control section 90 causes the current measuring section 120 to measure the electric currents supplied to the electronic device 20 as quiescent currents based on the reference supply voltage accumulated in the capacitor 100 and the terminal voltage. In addition, after the elapse of a predetermined period from starting the current measurement, the test control section 90 may turn off the switch 148 and cause the current measuring section 120 to measure the electric currents supplied to the electronic device 20 based on the after-correction reference supply voltage accumulated in the capacitor 146 and the terminal voltage as quiescent currents.

The current measuring apparatus 10 described above can supply the electric currents based on a difference between the reference supply voltage accumulated in the capacitor 100 and/or the capacitor 146 and the terminal voltage to the electronic device 20, and thus reduce noise currents. Moreover, the current measuring section 120 can measure the electric currents supplied to the electronic device 20 with high precision. Moreover, the reference supply voltage can be corrected in accordance with the electric currents supplied to the electronic device 20, and a stable voltage can be supplied to the electronic device 20 in which leakage currents are changed in accordance with a voltage. Moreover, the current measuring apparatus 10 can reduce the terminal voltage during the setup period for the quiescent current test in comparison to the terminal voltage during the current measurement, in order to prevent a temperature of the electronic device 20 from increasing.

Figure 3:
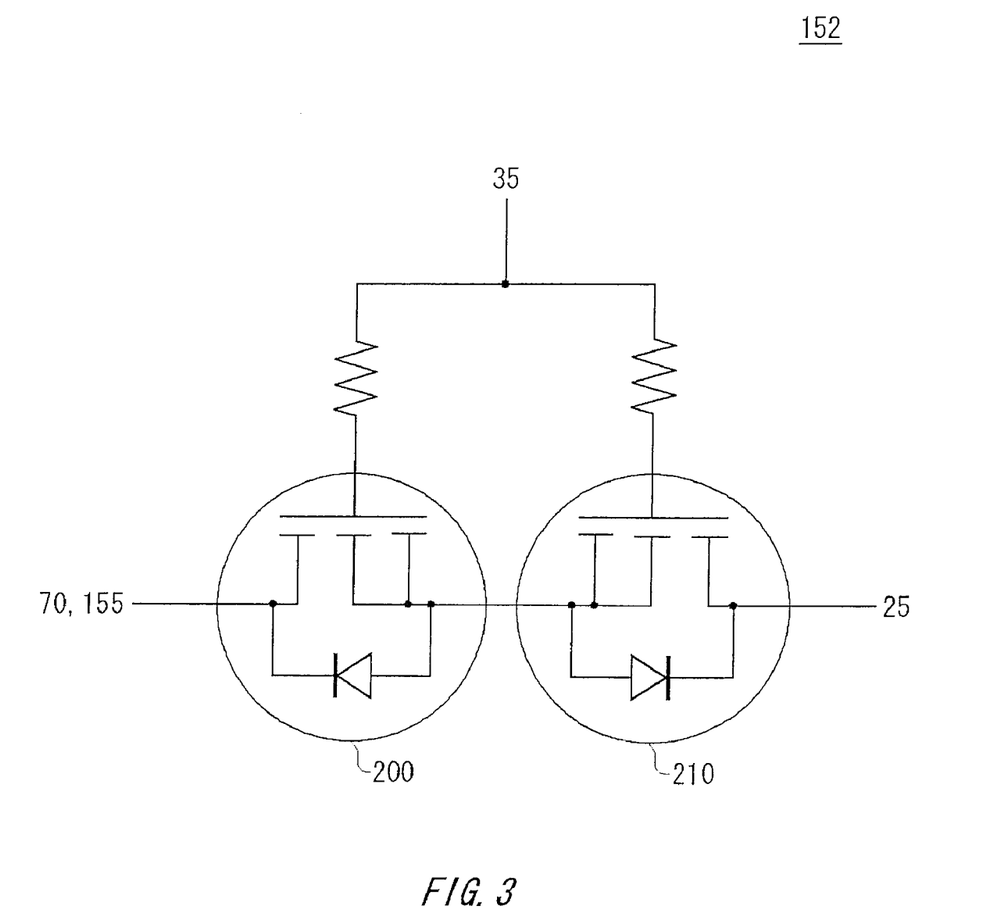
FIG. 3 is a view showing a configuration of a switch 152 and a switch 174 according to an embodiment of the present invention.

FIG. 3 is a view showing a configuration of the switch 152 according to the present embodiment. The switch 152 is provided between a contact point of the wire between the power supply 150 and the input terminal 25 and the wire between the end of the switch 102 that is not connected to the capacitor 100 and the power supply 150 and the output terminal of the power supply 150. The switch 152 serially has a transistor 200 and a transistor 210 between both ends thereof. The transistor 200 is provided between the output terminal of the power supply 150 and the above-mentioned contact point, and blocks electric currents flowing from the output terminal side of the power supply 150 into the contact point side when being turned off. On the other hand, even when it is turned off, backward-direction currents may flow to some extent. The transistor 210 is provided between the output terminal of the power supply 150 and the above-mentioned contact point, and blocks electric currents flowing from the contact point side to the output terminal side of the power supply 150 when being turned off. On the other hand, even when it is turned off, backward-direction currents may flow to some extent.

The above described switch 152 can prevent any electric current from being supplied to/from the current measuring section 40 in both of the forward and the backward directions during testing the quiescent current, so that the electric currents supplied to the electronic device 20 can be accurately measured. In addition, the switch 174 may take a configuration similar to that of the switch 152. In this case, the current flow between it and the current measuring section 30 can be bidirectionally prevented during the operating current test.

Figure 4:
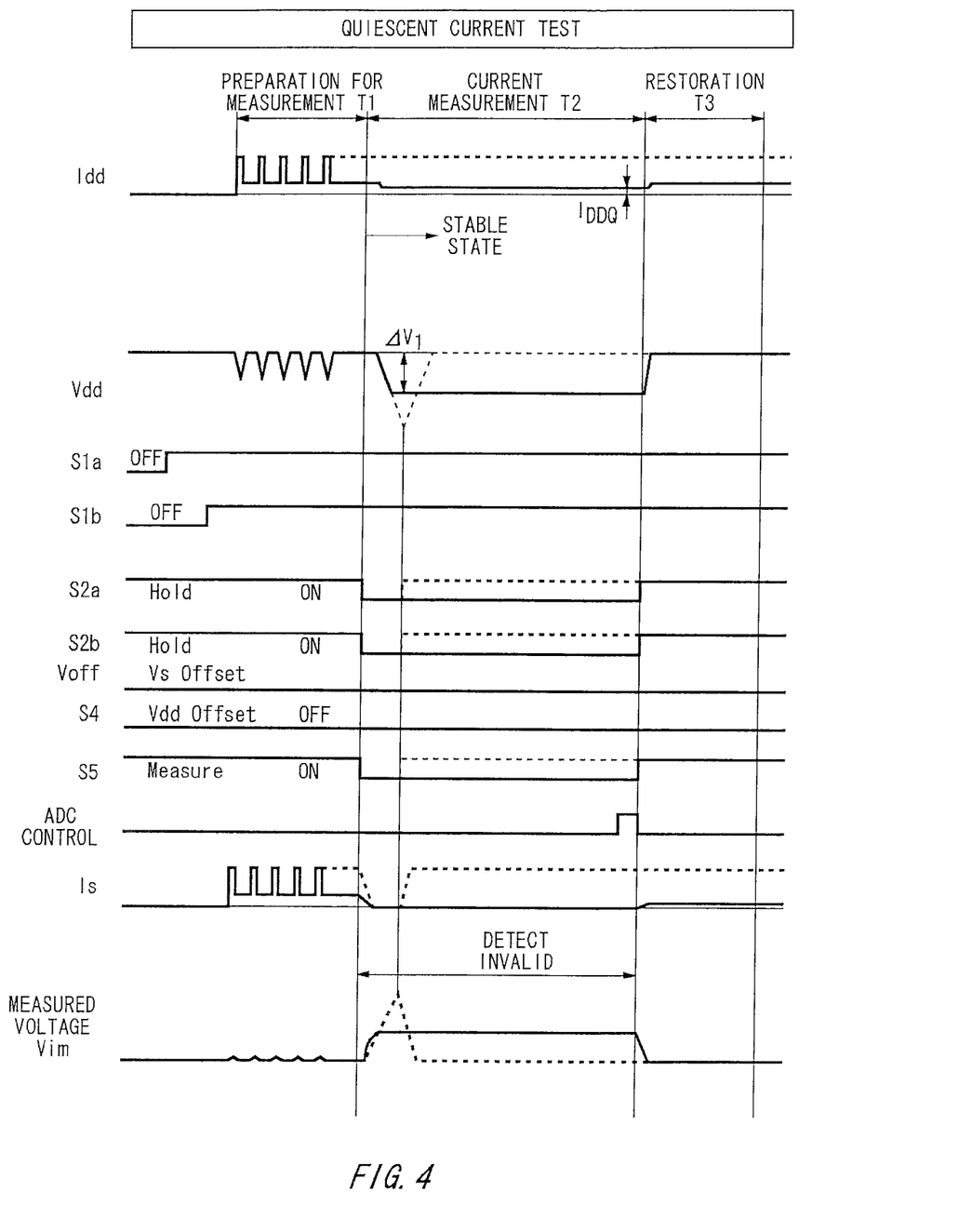
FIG. 4 is a view showing a first operation example of the current measuring apparatus 10 according to an embodiment of the present invention.

FIG. 4 is a view showing a first operation example of the current measuring apparatus 10 according to the present embodiment. The first operation example shows a high-speed operation mode for performing a test at high speed without correcting the reference supply voltage according to the supply currents supplied to the electronic device 20.

The quiescent current test has three periods that are divided into a measurement setup period (a setup period) T1 for performing a setup to measure the supply currents of the electronic device 20, a current measurement period T2 for measuring the supply currents Iddq in a stationary state of the electronic device 20, and a restoration period T3).

In the measurement setup period T1, the test control section 90 turns on the switch 170 (S1a), the switch 174 (S1b), the switch 152 (S2a), the switch 102 (S2b), and the switch 148 (S5). According to this, the voltage output from the current measuring section 40 is supplied to the electronic device 20 and is accumulated in the capacitor 100. In order not to correct the reference supply voltage in the present operation example, the switch 141 (S4) is turned off and the switch 144 is turned on during the quiescent current test period. Moreover, since an operation at a voltage-variable mode in the present operation example is not performed, the switch 163 (S3) is turned off and the switch 166 is turned on during the quiescent current test period. As a result, the offset voltage Voff output from the voltage adjusting section 160 becomes 0V.

In the measurement setup period T1, the current measuring apparatus 10 supplies a test signal sequence to the electronic device 20 so as to make it a stationary state that becomes an object for the quiescent current test. According to this operation, the electric currents Idd consumed by the electronic device 20 is changed. On the contrary, the current measuring section 40 supplies electric currents Is according to the electric currents consumed by the electronic device 20 to the input terminal 25 and stabilizes the terminal voltage Vdd.

When the setup of the electronic device 20 is completed, the current measurement period T2 is initiated. When the current measurement period T2 is initiated, the switch 152 (S2a), the switch 102 (S2b), and the switch 148 (S5) are disconnected. The current supplying section 110 can supply to the input terminal 25 electric currents based on a difference between the reference supply voltage accumulated in the capacitor 100 and the capacitor 146 and the terminal voltage of the input terminal 25.

The measuring section 124 and/or the measuring section 132 within the current measuring section 120 measure a voltage output from an internal analog-to-digital converter at a predetermined timing with the current measurement period T2, in other words, for example, after a predetermined period elapses from disconnecting the switch 152 (S2a), the switch 102 (S2b), and the switch 148 (S5). Then, a current value for the quiescent currents supplied to the electronic device 20 is obtained based on the measured voltage.

Then, in the restoration period T3, the switch 152 (S2a), the switch 102 (S2b), and the switch 148 (S5) are turned on again, and the supply of electric currents from the current measuring section 40 to the electronic device 20 is resumed.

As described above, when a current supply from the current measuring section 30 is begun, the terminal voltage of the input terminal 25 may be decreased by a voltage ΔV1 in comparison with the reference supply voltage accumulated in the capacitor 100. Here, depending on a type of the electronic device 20, the electronic device 20 may have a function by which a reset operation is automatically performed to initialize the inside when the power supply voltage is decreased. In a test of such the electronic device 20, when large currents flow during the current measurement period T2, the terminal voltage Vdd becomes lower than a threshold voltage acting as a reference for resetting and is initialized. In this case, for example, the electric currents Iddq received by the electronic device 20 is deteriorated, a defective is judged as a pass by mistake, and the measurement is performed in a state different from an internal state of the electronic device 20 that becomes an object for a test.

Thus, during the current measurement period T2, when the supply current measured by the current measuring section 120 has become larger than a preset threshold current, the measurement invalidity detecting section 180 detects that this current measurement is invalid. Then, when detecting invalidity of the current measurement, the measurement invalidity detecting section 180 turns on the switch 152 (S2a) in order to supply electric currents from the power supply 150 to the electronic device 20. Here, the measurement invalidity detecting section 180 compares a measured voltage Vim output from the difference operator 122 with a threshold voltage output from the voltage source 182, in order to detect that the supply current becomes larger than the threshold current. The operation when invalidity of the current measurement is detected is shown by a dashed line in FIG. 4.

According to this, the current can be supplied from the current measuring section 40 to the electronic device 20 before the terminal voltage of the input terminal 25 is lower than the threshold voltage acting as a reference for resetting, and thus the reset of the electronic device 20 can be prevented.

Figure 5:
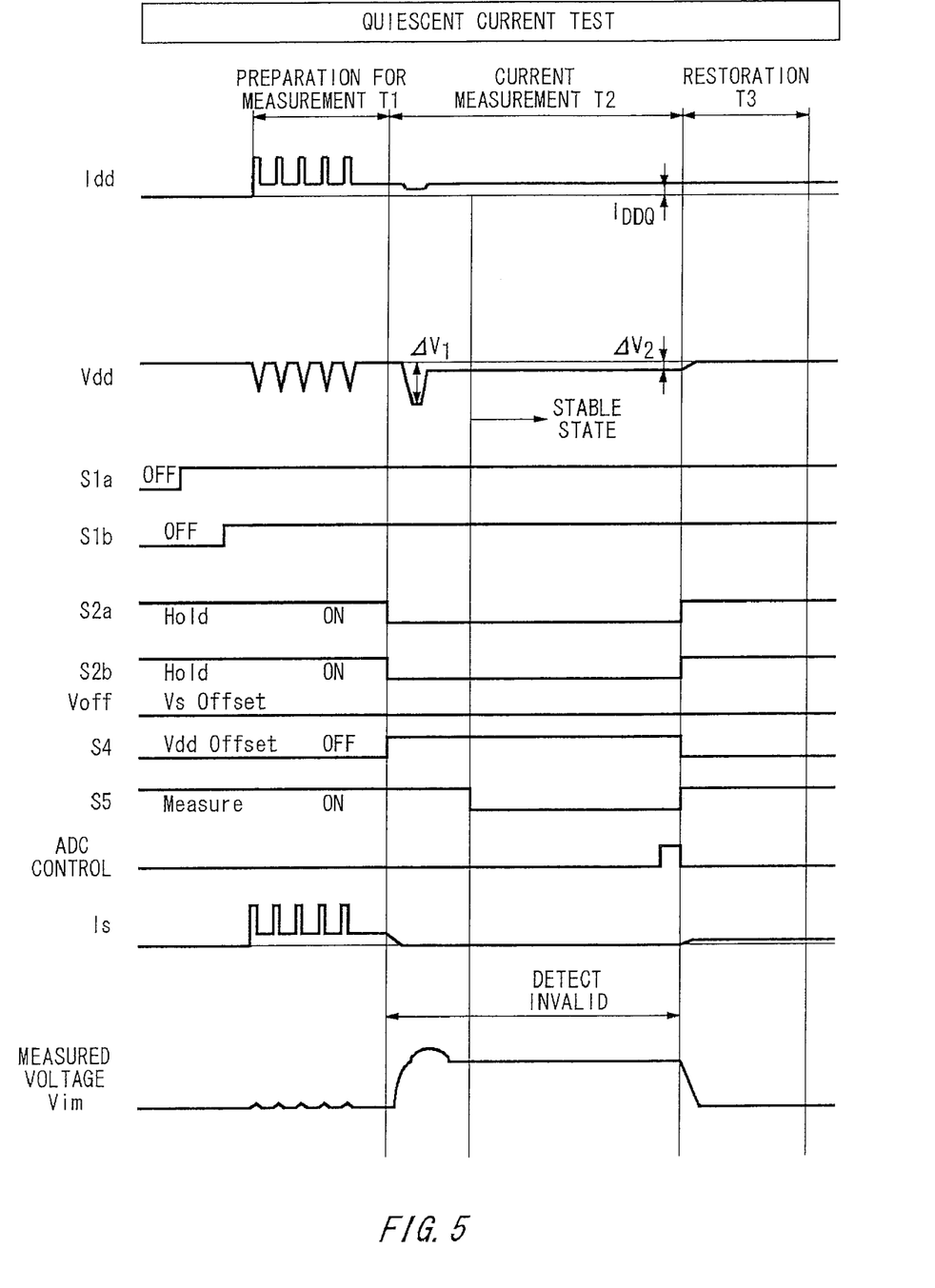
FIG. 5 is a view showing a second operation example of the current measuring apparatus 10 according to an embodiment of the present invention.

FIG. 5 is a view showing an operation at a voltage correction mode as a second operation example of the current measuring apparatus 10 according to the present embodiment.

First, a principle of the voltage correction mode is shown. When the electric currents received by the electronic device 20 depends on the terminal voltage, the quiescent currents measured by the measuring section 124 or the measuring section 132 are also changed when the terminal voltage Vdd varies.

More specifically, assuming that an ideal terminal voltage accumulated in the capacitor 100 is Vs, a real terminal voltage is Vdd, among the quiescent currents of the electronic device 20, an electric current that does not depend on the terminal voltage Vdd is Idd1, an electric current that depends on the terminal voltage Vdd is Idd2, and equivalent resistance of a circuit that depends on the terminal voltage Vdd in the electronic device 20 is RL, the following expression is accomplished.

$$(Va-Vb)=Vs\cdot(1+G)-Vdd\cdot(1+G) \quad \text{(Expression 1)}$$

Here, Va is a voltage of an end of the difference amplifier 112 side in the resistor 118 and Vb is a voltage of an end of the input terminal 25 side in the resistor 118. Moreover, G is an amplification factor of the difference amplifier 112, and is obtained by G=Rf/Ri from a resistance value Rf of the resistor 114 and a resistance value Ri of the resistor 113.

Here, the left part of Expression 1 can be transformed into the following Expression 2.

$$(Va-Vb)=Rm\cdot(Idd1+Idd2)=Rm\cdot(Idd1+Vdd/RL) \quad \text{(Expression 2)}$$

When transforming the left part of Expression 1 by Expression 2 and solving the transformed expression about Vdd, the following expression is obtained.

$$Vdd=Vs\cdot(1+G)\cdot X1-Idd1\cdot Rm\cdot X1 \quad \text{(Expression 3)}$$

Here, X1=RL/(Rm+RL·(1+G))

Here, when the electric currents Idd received by the electronic device 20 perfectly depends on a voltage, for example, assuming that Vs=1V, Idd1=0 A, Idd2=10 mA, Rm=200Ω, and G=50, RL becomes 100Ω (=1V/10 mA). When substituting these in Expression 3, Vdd becomes 0.962V and a voltage drop of 38 mV is generated. Therefore, while the measured current becomes 10 mA (=Vs/RL) when the terminal voltage is the ideal value of 1V, the measured current of 9.62 mA (=Vdd/RL) is actually measured.

Thus, in the voltage correction mode, there is performed a correction in which a correction voltage according to the difference voltage output from the difference operator 122 is added to the reference supply voltage. More specifically, the adder 145 performs the correction in which a voltage obtained by multiplying the difference voltage of the difference operator 122 by 1/N2 is added to the reference supply voltage Vs. A method for setting this N2 is shown below.

When this correction is added to Expression 1, the following expression is obtained.

$$(Va-Vb)=(Vs+(Vs-Vb)/N2)\cdot(1+G)-Vdd\cdot(1+G) \quad \text{(Expression 4)}$$

When solving Expression 4 about Vdd, the following expression is obtained.

$$Vdd=Vs-(Va-Vb)\cdot(1-(1+G)/N2)/(1+G) \quad \text{(Expression 5)}$$

When N2=G+1 in Expression 5, Vdd becomes Vs regardless of (Va−Vb), in other words, Idd1 and Idd2 values. Therefore, the adder 145 amplifies the difference voltage output from the difference operator 122 by the amplification factor obtained by adding one to the amplification factor of the difference amplifier 112 and performs a correction adding the amplified voltage to the reference supply voltage, in order to correct the terminal voltage. In this case, the correction section 140 performs a correction for applying the larger reference supply voltage when a larger difference voltage is detected, and performs a correction for applying the smaller reference supply voltage when a smaller difference voltage is detected.

Next, an operation at the voltage correction mode for performing the above-mentioned correction is mainly shown around a difference between the operation and the operation example of FIG. 4. First, in the measurement setup period T1, the current measuring apparatus 10 performs a setup similarly to that for the high-speed mode in FIG. 4.

When the setup for the electronic device 20 is completed, the current measurement period T2 is initiated. When the current measurement period T2 is initiated, the switch 152 (S2a) and the switch 102 (S2b) are disconnected. According to this, the capacitor 100 can supply the accumulated reference supply voltage to the adder 145. Moreover, the switch 141 (S4) is turned on and the switch 144 is turned off, in order to accumulate the difference voltage in the capacitor 143. Moreover, the switch 148 (S5) holds an ON state as it is.

Next, since the difference voltage is accumulated in the capacitor 143 after a predetermined period elapses, the switch 141 (S4) is turned off. According to this, the capacitor 143 can supply the accumulated difference voltage to the adder 145.

Next, after the switch 141 (S4) is turned off, the adder 145 outputs a voltage obtained by adding a correction voltage based on the difference voltage accumulated in the capacitor 143 to the reference supply voltage accumulated in the capacitor 100 as a reference supply voltage after correcting. Then, since the reference supply voltage after correcting is accumulated in the capacitor 146 after a predetermined period elapses, the switch 148 (S5) is turned off. According to this, the capacitor 146 can supply the accumulated reference supply voltage after correcting to the difference amplifier 112.

The current supplying section 110 supplies the input terminal 25 with the electric currents based on a difference between the reference supply voltage after correcting accumulated in the capacitor 146 and the terminal voltage of the input terminal 25. According to this, the current supplying section 110 can substantially harmonize the terminal voltage of the input terminal 25 with the ideal voltage Vs accumulated in the capacitor 100.

Hereinafter, similarly to the operation example in FIG. 4, a current value is measured and an operation for the restoration period T3 is performed. Moreover, in the present operation example, the measurement invalidity detecting section 180 also detects invalidity of a measurement.

According to the voltage correction mode described above, it is possible to measure quiescent currents in the state where the terminal voltage of the input terminal 25 is closed to the ideal value by adding the correction voltage according to the difference voltage to the reference supply voltage. According to this, the quiescent currents of the electronic device 20 in which consumed currents are changed depending on the terminal voltage can be appropriately measured.

In addition, in the voltage correction mode, since voltages are accumulated in the capacitor 143 and the capacitor 146, the current measurement period T2 may become longer than that of the high-speed mode. In such the current measuring apparatus 10, it is preferable to separately use the high-speed mode and the voltage correction mode by a characteristic of the electronic device 20.

Moreover, the capacity of the capacitor 100, the capacitor 146, the capacitor 143, and the capacitor 165 may be determined based on the maximum Off time of the switch 102, the switch 148, the switch 141, and the switch 163 corresponding to each capacitor, leak(age currents from the capacitors in the state that these switches are turned off, and a permitted voltage fluctuation. As an example, when the maximum Off time of the switch 102 is 1 ms, the leakage currents from the capacitor 100 in the state that the switch 102 is turned off is 1 nA, and the permitted voltage fluctuation is 10 μV, the capacity of the capacitor 100 is 1 nA*1 ms/10 μV=0.1 μF.

Figure 6:
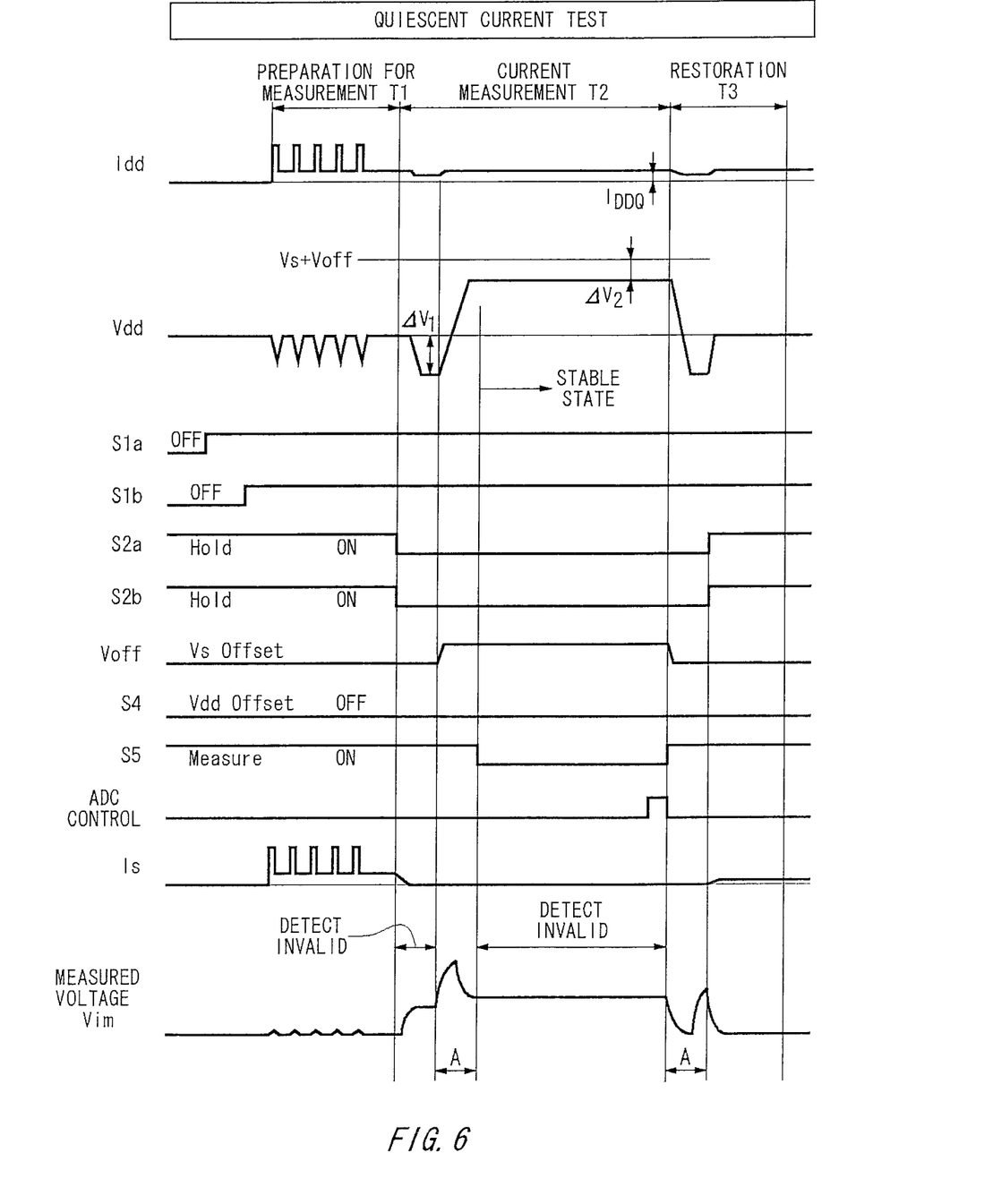
FIG. 6 is a view showing a third operation example of the current measuring apparatus 10 according to an embodiment of the present invention.

FIG. 6 is a view showing an operation at the voltage-controlled mode as a third operation example of the current measuring apparatus 10 according to the present embodiment. Since the operation in the present drawing is substantially similar with the operation in FIG. 4 except the points shown in the below, the description except the different points will be omitted.

First, in the measurement setup period T1, the test control section 90 makes the current measuring section 40 output the reference supply voltage Vs that is low by a predetermined offset voltage Voff in comparison with the ideal voltage being supplied to the electronic device 20 during the current measurement. This reference supply voltage Vs is determined in a range in which the current measuring apparatus 10 can perform a setting of the electronic device 20 during the measurement setup period T1. According to this, the capacitor 100 accumulates this reference supply voltage Vs.

When the setup of the electronic device 20 is completed, the current measurement period T2 is initiated. When the current measurement period T2 is initiated, the switch 152 (S2a) and the switch 102 (S2b) are disconnected. According to this, the capacitor 100 can supply the accumulated reference supply voltage Vs to the adder 145.

Next, after a predetermined period elapses, the test control section 90 makes the voltage adjusting section 160 output the above-mentioned offset voltage Voff. As a result, the adder 145 outputs a reference supply voltage Vs+Voff after the adjustment obtained by adding the offset voltage Voff to the reference supply voltage Vs accumulated in the capacitor 100. In this way, the terminal voltage of the input terminal 25 rises to approach the voltage Vs+Voff. Here, in place of directly changing the offset voltage output from the voltage adjusting section 160 from 0V to the final value Voff, the test control section 90 may raise the offset voltage from 0V to the final value Voff step-by-step. In addition, the resistance value and the capacity may be set in the resistor 164 and the capacitor 165 in order to slowly raise the offset voltage.

Next, after a predetermined period elapses, the test control section 90 turns off the switch 148 (S5). According to this, the capacitor 146 can supply the accumulated reference supply voltage Vs+Voff to the difference amplifier 112.

Hereinafter, similarly to the operation example in FIG. 4, a current value is measured and an operation for the restoration period T3 is performed. In this restoration, the voltage adjusting section 160 returns the offset voltage to 0V in order to reduce the terminal voltage of the electronic device 20.

In the present operation example, the measurement invalidity detecting section 180 also detects invalidity of a measurement. Here, in the voltage-variable mode, until the increase of the terminal voltage is terminated after the voltage adjusting section 160 outputs the offset voltage, it is required to charge the capacitor 50 and the capacitor 119 in accordance with the voltage increase. For this reason, the supply currents from the current measuring section 30 may be temporarily increased, and the difference voltage of the difference operator 122 may become larger than the threshold voltage of the voltage source 182. Therefore, until the increase of the terminal voltage is terminated after the voltage adjusting section 160 raises the offset voltage, the measurement invalidity detecting section 180 does not perform the invalidity detection. In order to realize this, the measurement invalidity detecting section 180 may prohibit the invalidity detection until the switch 148 (S5) is turned off.

According to the operation example described below, the terminal voltage for the measurement setup period T1 can be kept low in comparison with the terminal voltage for the current measurement period T2. According to this, it is possible to prevent that temperature of the electronic device 20 rises in accordance with the operation of the electronic device 20 during the setup period and thus high quiescent currents are measured.

In addition, the above-mentioned voltage-variable mode may be used along with the high-speed mode and/or the voltage correction mode. In this case, after the increase of the terminal voltage is terminated and the terminal voltage is stabilized, the switch 141 (S4) is turned off before the switch 148 (S5) is turned off, and makes the capacitor 143 supply the correction voltage according to the terminal voltage during the current measurement.

Figure 7:
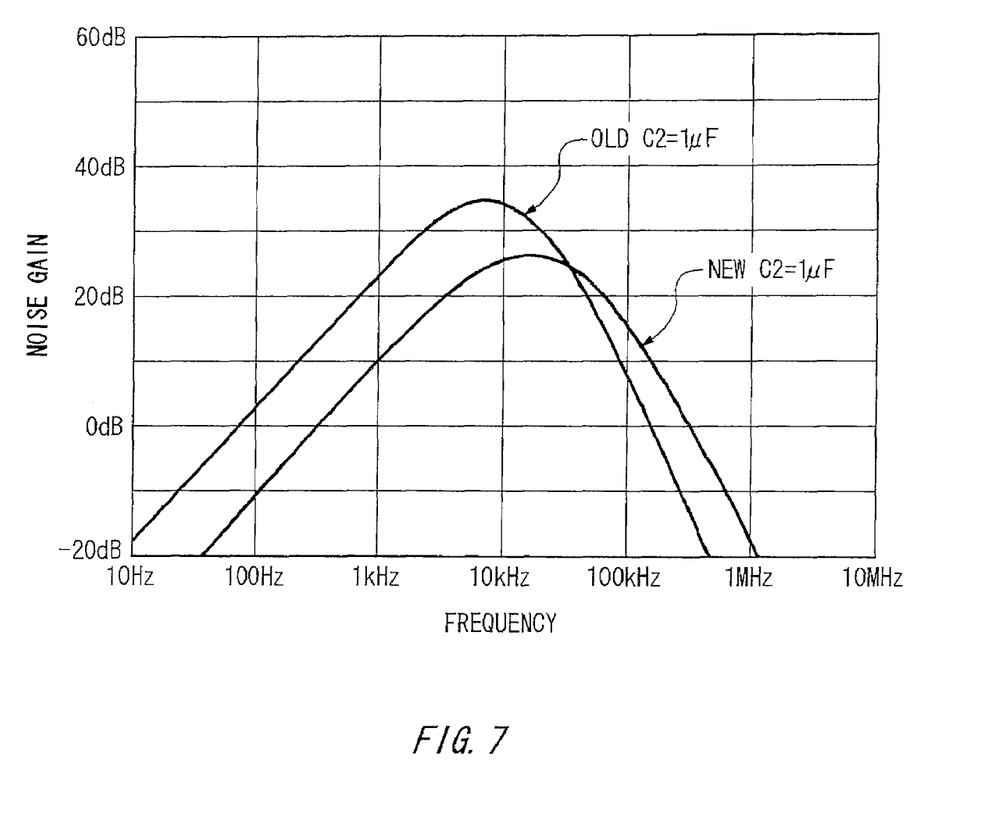
FIG. 7 is a view showing a noise reduction effect of the current measuring apparatus 10 according to an embodiment of the present invention.

FIG. 7 is a view showing a result obtained by simulating a noise reduction effect of the current measuring apparatus 10 according to the present embodiment. FIG. 7 shows a noise gain by the configuration in Patent Document 1 (OLD (conventional)) and a noise gain of the current measuring section 30 at the high-speed mode in the present embodiment (NEW (the present embodiment)) when the capacitor 50 is 1 μF.

In the conventional configuration, a resistor and a capacitor provided in parallel between an output of the difference operator and the electronic device 20 are 200Ω and 0.01 μF, and a resistor further provided between these resistor and capacitor and the electronic device 20 is 5Ω. In the conventional configuration, noises of the voltage source are output from the difference operator along with noises of the output of the difference operator.

On the other hand, in the configuration of the present embodiment, it is assumed that the capacitor 100 is 0.1 μF, the resistor 113 is 1KΩ, the resistor 114 is 40KΩ, the resistor 118 is 200Ω, the capacitor 119 is 0.1 μF, and a resistance value when the switch 174 is turned on is 0.1Ω. In the configuration of the present embodiment, the voltage of the capacitor 100 does not have noises and noises occur in the voltage follower 172 and the difference amplifier 112. Then, the noises of the voltage follower 172 are increased to G (=Rf/Ri=40) times and the noises of the difference amplifier 112 are increased to 1+G (=41) times, and these increased noises are output.

Moreover, in regard to the resistance value Ri of the resistor 113 and the resistance value Rf of the resistor 114, noises of Ri become dominant because Rf/Ri is large. Moreover, noises of the resistance value Rm of the resistor 118 are not amplified.

Under the above-mentioned condition, the simulated result for the noise gains caused by the conventional configuration and the configuration of the present embodiment is shown in FIG. 7. In addition, in the present simulation, it is assumed that the resistance value of the electronic device 20 during the current measurement is 100Ω. Moreover, it is assumed that the output from the difference operator 122 is supplied to the measuring section 124 or the difference amplifier 130 via a low-pass filter for passing a band less than or equal to 10 KHz.

As shown in FIG. 7, compared with the conventional current measuring apparatus, the current measuring apparatus 10 according to the present embodiment can drastically reduce the noises generated in the supply currents and the measured currents with respect to the usually generated noises less than or equal to about 10 KHz.

In addition, it is desirable that the resistance value of the resistor 113 is smaller than a value obtained by converting a voltage noise of the difference amplifier 112 into a thermal noise of the resistor. In other words, for example, when the voltage noise of the difference amplifier 112 is $5 nV/\sqrt{Hz}$ and this voltage noise is converted into the thermal noise of the resistor, the following resistance value Rx is obtained.

$$Rx = En \cdot En/(4 \cdot k \cdot t) = 5nV * 5nV/(4*1.38*10^{-23}*300) = 1.510 K\Omega \quad \text{(Expression 6)}$$

Here, k shows the Boltzmann constant and t shows absolute temperature in a use environment.

In this case, it is desirable that the resistance value Ri of the resistor 113 is a smaller value than the above-mentioned Rx.

Although an aspect of the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

According to an embodiment of the present invention, even when a capacitor for stabilizing a power supply is connected to a terminal of an electronic device, noises generated in electric currents supplied to this terminal can be reduced and a voltage fluctuation of this terminal can be restrained.

What is claimed is:

1. A current measuring apparatus that measures an electric current received by an electronic device from an input terminal, the current measuring apparatus comprising:
   a first voltage accumulator that accumulates a reference supply voltage that acts as a reference for a voltage being supplied to the electronic device during measuring electric currents;
   a first switch that connects a power supply to the first voltage accumulator to accumulate the reference supply voltage before measuring electric currents and disconnects the power supply from the first voltage accumulator during measuring electric currents;
   a current supplying section that supplies an electric current based on the reference supply voltage accumulated in the first voltage accumulator and a terminal voltage of the input terminal to the electronic device during measuring electric currents; and
   a first current measuring section that measures the supply current supplied to the electronic device.

2. The current measuring apparatus as claimed in claim 1, wherein
   the current supplying section includes:
   a first difference amplifier that amplifies a difference obtained by subtracting the terminal voltage from the reference supply voltage, adds the amplified voltage to the reference supply voltage, and outputs the added voltage; and
   a resistor that is connected between an output of the first difference amplifier and the input terminal and supplies the supply current according to a difference between the output voltage output from the first difference amplifier and the terminal voltage to the input terminal.

3. The current measuring apparatus as claimed in claim 2, wherein
   the first current measuring section includes:
   a difference operator that outputs a difference voltage obtained by subtracting the terminal voltage of the input terminal side in the resistor from the output voltage of the first difference amplifier side in the resistor; and
   a measuring section that measures the supply current based on the difference voltage.

4. The current measuring apparatus as claimed in claim 3, wherein
   the first current measuring section further includes:
   a voltage source that outputs a preset reference voltage for measurement; and
   a second difference amplifier that outputs a difference amplification voltage obtained by amplifying a difference between the difference voltage and the reference voltage for measurement, and
   the measuring section measures the supply current based on the difference amplification voltage.

5. The current measuring apparatus as claimed in claim 4, wherein the first current measuring section further includes a low-pass filter that is connected between the voltage source and the second difference amplifier.

6. The current measuring apparatus as claimed in claim 3, further comprising a correction section that corrects the reference supply voltage by adding a correction voltage according to the difference voltage to the reference supply voltage, wherein
   the current supplying section supplies an electric current based on the reference supply voltage corrected by the correction section and the terminal voltage to the electronic device during measuring electric currents.

7. The current measuring apparatus as claimed in claim 6, wherein
   the correction section includes:
   an adder that adds the correction voltage according to the difference voltage to the reference supply voltage; and
   a second voltage accumulator that accumulates an output voltage of the adder and supplies the accumulated voltage to the first difference amplifier.

8. The current measuring apparatus as claimed in claim 7, wherein the correction section further includes a second switch that is provided between an output of the adder and the second voltage accumulator, connects the second voltage accumulator to the output of the adder to accumulate the output voltage of the adder for a predetermined period from starting a current measurement, and disconnects the second voltage accumulator from the output of the adder after the predetermined period elapses.

9. The current measuring apparatus as claimed in claim 8, wherein the first voltage accumulator and the second voltage accumulator are capacitors.

10. The current measuring apparatus as claimed in claim 1, further comprising:
- a power supply that supplies the reference supply voltage to the first voltage accumulator and the input terminal before measuring electric currents;
- a third switch that disconnects the power supply from the first voltage accumulator and the input terminal during measuring electric currents; and
- a voltage adjusting section that adds a predetermined offset voltage to the reference supply voltage accumulated in the first voltage accumulator and supplies the added voltage to the current supplying section during measuring electric currents, in order to increase the terminal voltage during measuring electric currents in comparison with the terminal voltage before measuring electric currents.

11. The current measuring apparatus as claimed in claim 10, wherein
the third switch:
- is provided between a contact point of a wire between the power supply and the input terminal and a wire between an end of the first switch that is not connected to the first voltage accumulator and the power supply and an output terminal of the power supply; and
- serially has a first transistor that blocks electric currents flowing from the output terminal side of the power supply to the contact point side and a second transistor that blocks electric currents from the contact point side to the output terminal side of the power supply between the output terminal of the power supply and the contact point when the third switch is turned off.

12. The current measuring apparatus as claimed in claim 11, further comprising:
- a fourth switch that is provided between a terminal of the input terminal side of the third switch and the first difference amplifier;
- a fifth switch that is provided between an end of the input terminal side of the resistor and the input terminal;
- a second current measuring section that measures an electric current being supplied to the input terminal by the power supply; and
- a test control section that controls an operating current test for measuring operating currents received by the electronic device during an operation and a quiescent current test for measuring quiescent currents received by the electronic device during quiescence, wherein
the test control section causes:
- the third switch to be turned on, the fourth and fifth switches to be turned off, and the second current measuring section to measure the electric current being supplied to the input terminal by the power supply as the operating currents in the operating current test; and
- the third switch to be turned off, the fourth and fifth switches to be turned on, and the first current measuring section to measure the electric current supplied to the electronic device based on the reference supply voltage accumulated in the first voltage accumulator and the terminal voltage as the quiescent currents in the quiescent current test.

13. The current measuring apparatus as claimed in claim 1, further comprising a measurement invalidity detecting section that detects that this current measurement is invalid when the supply current measured by the first current measuring section becomes larger than a preset threshold current value during measuring electric currents.

14. The current measuring apparatus as claimed in claim 13, further comprising:
- a power supply that supplies the reference supply voltage to the first voltage accumulator and the input terminal before measuring electric currents; and
- a third switch that disconnects the power supply from the first voltage accumulator and the input terminal during measuring electric currents, wherein
the measurement invalidity detecting section turns on the third switch to make the third switch supply electric currents from the power supply to the electronic device when it is detected that the current measurement is invalid.

15. A test apparatus that tests an electronic device, comprising:
- a first voltage accumulator that accumulates a reference supply voltage that acts as a reference for a voltage being supplied to the electronic device during measuring electric currents;
- a first switch that connects a power supply to the first voltage accumulator to accumulate the reference supply voltage before measuring electric currents and disconnects the power supply from the first voltage accumulator during measuring electric currents;
- a current supplying section that supplies an electric current based on the reference supply voltage accumulated in the first voltage accumulator and a terminal voltage of an input terminal of the electronic device to the electronic device during measuring electric currents; and
- a first current measuring section that measures a supply current supplied to the electronic device.

16. A current measuring method for measuring an electric current received by an electronic device from an input terminal, the current measuring apparatus comprising:
- accumulating a reference supply voltage that acts as a reference for a voltage being supplied to the electronic device in a first voltage accumulator during measuring electric currents;
- connecting a power supply to the first voltage accumulator to accumulate the reference supply voltage before measuring electric currents and controlling a first switch so as to disconnect the power supply from the first voltage accumulator during measuring electric currents;
- supplying an electric current based on the reference supply voltage accumulated in the first voltage accumulator and a terminal voltage of the input terminal to the electronic device during measuring electric currents; and
- measuring the supply current supplied to the electronic device.

17. A test method for testing an electronic device, comprising:
- accumulating a reference supply voltage that acts as a reference for a voltage being supplied to the electronic device in a first voltage accumulator during measuring electric currents;
- connecting a power supply to the first voltage accumulator to accumulate the reference supply voltage before measuring electric currents and controlling a first switch so as to disconnect the power supply from the first voltage accumulator during measuring electric currents;
- supplying an electric current based on the reference supply voltage accumulated in the first voltage accumulator and a terminal voltage of an input terminal of the electronic device to the electronic device during measuring electric currents; and
- measuring the supply current supplied to the electronic device.

* * * * *